United States Patent [19]

Tsukamoto

[11] 4,198,610

[45] Apr. 15, 1980

[54] AUDIO AMPLIFIER

[76] Inventor: Kenkichi Tsukamoto, 47, Koyamashimofusa-Cho, Kita-Ku, Kyoto-Shi, Kyoto-Fu, Japan

[21] Appl. No.: 883,985

[22] Filed: Mar. 6, 1978

[30] Foreign Application Priority Data

Mar. 11, 1977 [JP] Japan .................. 52-25926

[51] Int. Cl.² .................. H03F 3/185; H03F 3/45
[52] U.S. Cl. .................. 330/253; 330/258; 330/300
[58] Field of Search .............. 330/253, 257, 258, 277, 330/288

[56] References Cited

U.S. PATENT DOCUMENTS

| 3,401,351 | 9/1968 | Ellestad | 330/258 X |
| 3,854,101 | 12/1974 | Muramatsu | 330/253 |

*Primary Examiner*—James B. Mullins
*Attorney, Agent, or Firm*—Ladas, Parry, Von Gehr, Goldsmith & Deschamps

[57] ABSTRACT

In active element of an audio amplifier, there exists a neutral point in which the amplification is minimum. When the middle point of AC mode in a circuit is coincident with the neutral point, noise elements accompanying with input signals are not amplified, i.e. the signal-to-noise ratio of an audio amplifier is improved. The middle point of AC mode in a circuit can be varied by adjusting resistors or capacitors of the circuit.

3 Claims, 6 Drawing Figures

AUDIO AMPLIFIER

BACKGROUND OF THE INVENTION

This invention relates to audio amplifiers, and more particularly to elimination of noises from such an audio amplifier.

In general, noises caused by an electrical semiconductor element are shot noise caused by the irregular motion of carriers passing through the p-n junction, a thermal noise due to the channel resistance or the base diffusion resistance, and a 1/f noise cause by the recombination, in the base surface, of carriers injected from the emitter and by the leak current in the collector junction, for instance. It is known in the art that the electromotive force (or current) caused by such a noise depends on the magnitude of a signal applied to or injected into the element, and the probability of the electromotive force which reaches a certain noise electromotive force assumes a Gaussian distribution.

A conventional audio amplifier is so designed as to select an operating point at which the noise factor at a predetermined input resistance thereof is minimum. However, as noises caused upon arrival of a signal are not periodic signals, it is difficult to sufficiently apply feedback thereto, and the noises caused in the active elements are amplified and outputted by these active elements. It is considered that this difficulty accompanying the conventional audio amplifier is due to the following reason. That is, upon arrival of an AC audio signal the circuit is not balanced in the resulting AC mode of operation although it is balanced by proper biasing in its "no-signal" or DC mode. In other words, heretofore a reference by which the circuit should be balanced (in an AC mode) for a signal applied thereto has not been analyzed.

SUMMARY OF THE INVENTION

Accordingly, an object of this invention is to eliminate all of the above-described difficulties accompanying a conventional audio amplifier.

More specifically, an object of the invention is to provide an audio amplifier which will not substantially amplify noises thereby to improve the signal-to-noise ratio.

The foregoing objects and other objects of the invention have been achieved by the provision of an audio amplifier in which the impedances of the right and left sides, as viewed from the neutral point in an AC mode in the noise generating region of an active element to which a signal is applied, of the amplifier are made equal to each other so that the neutral point assumes the middle point in an AC mode of the amplifier.

This invention utilizes the fact that the neutral point in an AC mode with respect to the ground exists in the noise generating region in the active element, and when the potential of the neutral point with respect to the ground is not varied, the amplification of the active element is minimized, and therefore the active element can be regarded merely as a passive element, or a resistance element. If the impedances of the right and left sides, as viewed from the neutral point in the noise generating region, of the active element are made equal to each other in an AC mode with respect to the ground, then the neutral point assumes the middle point in an AC mode. Therefore, even if disturbance (such as noise electromotive force or noise current) occurs primarily in the active element for some reason such as the arrival of a signal, the neutral point potential is maintained unchanged. Accordingly, secondarily amplifying and outputting the disturbance by the active element is minimized. It is known that such a neutral point exists, in general, in the vicinity of a terminal (such as a gate or a base) to which a signal is injected.

The term "noise generating region" is intended to mean a region of the active element in which region a significant noise occurs. For instance, the region is the channel region and the p-n junction adjacent thereto of a field-effect transistor, and the base region and the p-n junction ajacent thereto of a transistor.

The nature, principle and utility of this invention will become more apparent from the following detailed description when read in conjunction with the accompanying drawings.

DETAILED DESCRIPTION OF THE INVENTION

Figure 1:
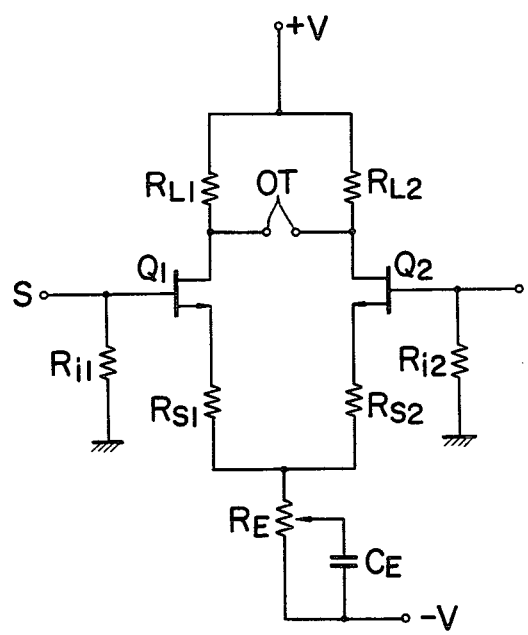
FIG. 1 is a circuit diagram showing one embodiment of this invention.

One embodiment of this invention is shown in FIG. 1. As is apparent from FIG. 1, a differential amplifier employing two field-effect transistors $Q_1$ and $Q_2$ as active elements is provided. More specifically, loads resistors $R_{L1}$ and $R_{L2}$ are connected to the drains of the transistors $Q_1$ and $Q_2$, and source resistors $R_{S1}$ and $R_{S2}$ are connected to the sources of the transistors $Q_1$ and $Q_2$, respectively. The other ends of the load resistors $R_{L1}$ and $R_{L2}$ are connected to one power supply ($+V$), while the other ends of the source resistors $R_{S1}$ and $R_{S2}$ are connected through a variable resistor $R_E$ and a capacitor $C_E$ to the other power supply ($-V$). Resistors $Ri_1$ and $Ri_2$ are input resistors, and an input signal of approximately 2 mV is applied to the resistor $Ri_1$ by a cartridge for instance.

The values of the load resistors $R_{L1}$ and $R_{L2}$, the source resistors $R_{S1}$ and $R_{S2}$, and the resistor $R_E$ are selectively determined in accordance with a well-known method in order to make gain, in-phase voltage cancelling factor, and drift current optimum. In practice, the variable resistance range of the variable resistor $R_E$ may be very small (for instance, it being of the order of 5 KΩ if its maximum resistance is 30 KΩ), and accordingly it can be made up of a fixed resistor and a variable resistor. On the other hand, the value of the capacitor $C_E$ is of the order of 0.1 μF, for instance, and it is provided to ground a part of the resistance $R_E$ in an AC mode in an audio frequency range.

Figure 2:
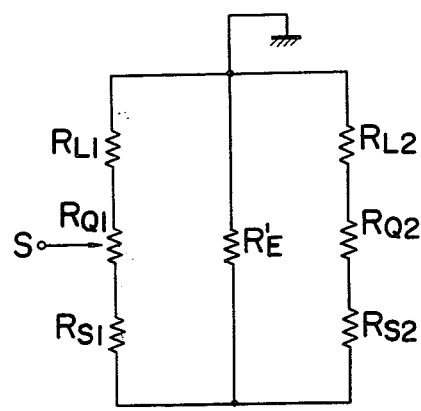
FIG. 2 is an equivalent circuit of the circuit diagram shown in FIG. 1.

The equivalent circuit, as viewed from a signal, of the amplifier thus organized is as shown in FIG. 2 if the channel resistances of the field-effect transistors $Q_1$ and $Q_2$ are represented by $R_{Q1}$ and $R_{Q2}$, respectively.

Referring back to FIG. 1, a signal S is applied to the signal injection terminal of transistor $Q_1$, and the resistance $R_E$ is adjusted while noises are being monitored at the output terminal OT by utilizing an oscillator, a filter capable of removing only the oscillation frequency of the oscillator, a spectrometer, etc., so as to minimize the noise components. In this case, in the equivalent circuit shown in FIG. 2 the combined resistance of the resistors $R_{L2}$, $R_{Q2}$, $R_{S2}$, $R_{S1}$ and $R_E'$ (which is the adjusted resistor $R_E$) becomes equal to the resistance of the resistor $R_{L1}$. More specifically, if it is assumed that the input signal is a sinusoidal wave of 1000 Hz, and $R_{L1}=R_{L2}=4.82$ K$\Omega$, $R_{S1}=R_{S2}=100$ $\Omega$, $R_{Q1}=14.52$ K$\Omega$, and $R_{Q2}=14.47$ K$\Omega$, then $R_E'=6.45$ K$\Omega$, and it has been found that the following equation is established:

$$R_{L1} = R_{S1} + \frac{R_E' (R_{L2} + R_{Q2} + R_{S2})}{R_E' + R_{L2} + R_{Q2} + R_{S2}}$$

In addition, it has been found that the point where the drain-source channel resistance $R_{Q1}$ in the channel of the field-effect transistor $Q_1$ is reduced to the half thereof is the neutral point of the element. Accordingly, it has been found that if such a neutral point is allowed to assume the middle point in an AC mode with respect to the ground of the amplifier, or if the impedances of the left side ($R_{L1}$) and right side (combined resistance), as viewed from the neutral point, of the amplifier are made to be equal to each other, then the noise components can be minimized.

Figure 3:
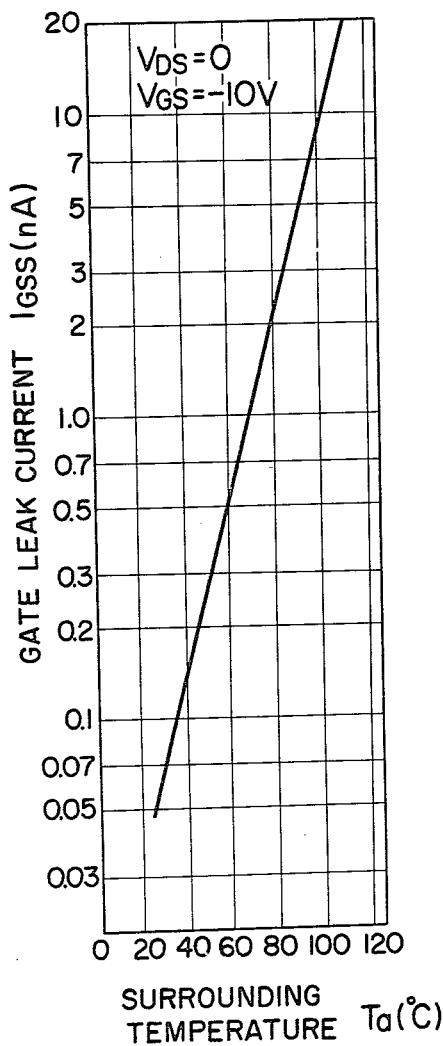
FIG. 3 is a graphical representation indicating the gate leakage current of a field-effect transistor.

As indicated in FIG. 3, the gate leakage current is of the order of nA, and if this current is allowed to flow in the input resistor $Ri_1$, then it may be superposed on the signal. Therefore, it is desirable that the voltage drop across the input resistor $Ri_1$ due to the gate leakage current is reduced to an extent which can be disregarded when compared with the input signal voltage. In addition, if the negative feedback input resistance $Ri_2$ is reduced so that $Ri_1=Ri_2$, then the DC drift and noise components can be reduced much more.

Figure 4:
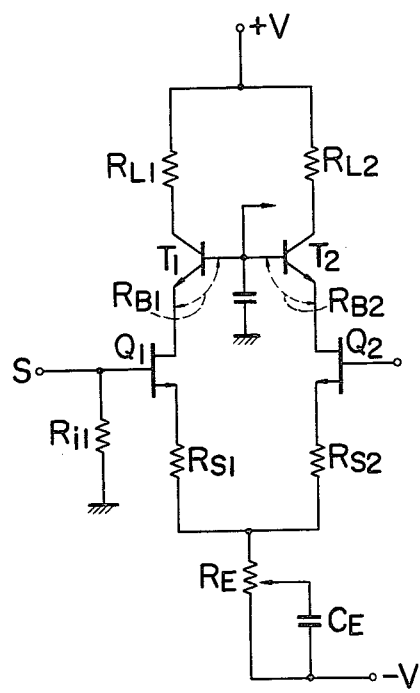
FIG. 4 is a circuit diagram showing another embodiment of the invention.
Figure 5:
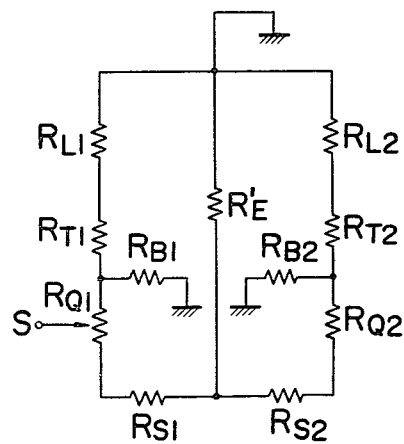
FIG. 5 is an equivalent circuit of the circuit diagram shown in FIG. 4.

Shown in FIG. 4 is another embodiment of the invention, which comprises a cascade connected circuit having field effect transistors $Q_1$ and $Q_2$ to the drains of which transistors $T_1$ and $T_2$ are connected, respectively. In this case, the equivalent circuit thereof, as shown in FIG. 5, includes resistances $R_{B1}$ and $R_{B2}$ which are connected to the bases of the transistors $T_1$ and $T_2$, and effects similar to those described with reference to the first embodiment can be obtained through operation similar to that in the first embodiment. In other words, in this case, influence due to the noise of the transistors $T_1$ and $T_2$ is much greater than that due to the noise of the field-effect transistors $Q_1$ and $Q_2$, and therefore the resistance $R_E'$ is so determined that the neutral point of the noise generating region in the transistors $T_1$ and $T_2$ assumes the middle point in an alternating current mode.

Furthermore, if in the circuit shown in FIG. 4 the cut-off frequency determined by the resistance $R_E$-$R_E'$ and the capacitance $C_E$ is selected to 1000 Hz and the resistance $R_E$ is so selected that the neutral point of the field-effect transistors $Q_1$ and $Q_2$ assumes the middle point in an alternating current mode, then it is possible to minimize the noise of the transistors $T_1$ and $T_2$ for signals whose frequencies are higher than 1000 Hz and to minimize the noise of the field-effect transistors $Q_1$ and $Q_2$ for signals ranging from a signal of 1000 Hz to a DC signal.

In the above description, the capacitor $C_E$ is combined with the variable resistor $R_E$; however, it goes without saying that the same effect can be obtained by combining the capacitor with any one of the other resistors in the circuit. The resistance of the variable resistor once adjusted may be left as it is. Furthermore, it is obvious that various transistors and vacuum tubes can be employed as the active elements. In addition, the invention has been described with reference to the differential amplifier; however, it should be noted that the invention is not limited thereby or thereto; that is, the technical concept of the invention can be applied to other amplifiers.

Figure 6:
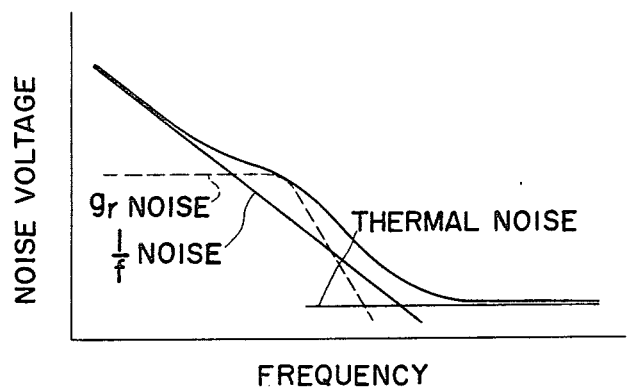
FIG. 6 is a graphical representation indicating a noise frequency characteristic.

In the noise frequency characteristic, the noise voltage in the lower frequency range is higher than that in the higher frequency range as indicated in FIG. 6. Therefore, with the conventional DC amplifier, its ability to provide the gain in the AC range for the DC range also is not sufficiently utilized; however, according to the invention, the ability of a DC amplifier can be greatly improved.

As is apparent from the above description, according to the invention, the neutral point in the noise generating region of the active elements is allowed to assume the middle point in an AC mode, and therefore, it is possible to provide an audio amplifier in which the signal-to-noise ratio is effectively improved without substantially amplifying the noise, and the ability of a DC amplifier is sufficiently utilized.

What is claimed is:

1. In a differential amplifier of the type comprising a pair of field effect transistors, load resistors respectively connecting the drain electrodes of said field effect transistors to a first DC power supply, input terminals respectively connected to the gate electrodes of said field effect transistors, source resistors respectively connecting the source electrodes of said field effect transistors to a second DC power supply by way of a common resistor, a capacitor connected in a given shunting relationship with said common resistor, and an output terminal connected between the drain electrode and load resistor of each field effect transistor, said load resistors, source resistors and common resistor having preselected resistances for optimizing the gain, common mode rejection and drift current of said differential amplifier, the improvement wherein:

said capacitor is connected between said second DC power supply and an intermediate point of said common resistor, said intermediate point and the capacitance of said capacitor being such that less than the entire preselected resistance of said common resistor is capacitatively shunted when an audio frequency AC input signal is applied to the input terminal of one of said field effect transistors, the unshunted remaining resistance of said common resistor, when combined in parallel with the sum of the drain-source channel resistance of the other field effect transistor and the preselected resistances of the load and source resistors of said other field effect transistor and added to the preselected resistance of the source resistor of said one field effect transistor, being equal to the preselected resistance of the load resistor of said one field effect transistor.

2. In an audio amplifier circuit having an AC mode in which an audio frequency AC input signal is applied to a signal injection terminal of an amplifying element and having a DC mode in which said input signal is not so applied, said circuit being DC-biased to minimize output noise in its DC mode and having a middle point in its AC mode on each side of which the circuit impedance to ground is the same at the frequency of said input signal, so that the potential of said middle point with respect to ground is not changed by said input signal, the improvement wherein said middle point of said circuit coincides with a point in said amplifying element, the potential of which with respect to ground is equal to that of said signal injection terminal, whereby amplification by said amplifying element of noise generated therein upon application of said input signal to said signal injection terminal is minimized.

3. The improvement according to claim 2, wherein the coincidence of said middle point of said circuit with said point in said amplifying element is provided by a capacitor connected in shunting relationship with a DC-biasing resistor used in the DC-biasing of said circuit to minimize said output noise in said DC mode of said circuit, said relationship being such that said DC-biasing resistor is partially capacitatively shunted to ground by an amount additionally minimizing the output noise corresponding to the noise generated in said amplifying element during the AC mode thereof.

* * * * *